(12) United States Patent
He

(10) Patent No.: US 11,927,602 B2
(45) Date of Patent: Mar. 12, 2024

(54) RADIO FREQUENCY EJECTOR PIN FOR PRODUCTION TESTING AND RADIO FREQUENCY TEST SYSTEM

(71) Applicant: SPREADTRUM COMMUNICATIONS (SHENZHEN) CO., LTD., Shenzhen (CN)

(72) Inventor: Chuan He, Shenzhen (CN)

(73) Assignee: SPREADTRUM COMMUNICATIONS (SHENZHEN) CO., LTD., Guangdong (CN)

( * ) Notice: Subject to any disclaimer, the term of this patent is extended or adjusted under 35 U.S.C. 154(b) by 121 days.

(21) Appl. No.: 17/739,936

(22) Filed: May 9, 2022

(65) Prior Publication Data

US 2022/0260624 A1 Aug. 18, 2022

Related U.S. Application Data

(63) Continuation of application No. PCT/CN2020/117836, filed on Sep. 25, 2020.

(30) Foreign Application Priority Data

Nov. 7, 2019 (CN) .......................... 201911079577.5

(51) Int. Cl.
*G01R 1/04* (2006.01)
*G01R 29/08* (2006.01)
*G08B 21/18* (2006.01)

(52) U.S. Cl.
CPC .............. *G01R 1/045* (2013.01); *G01R 1/04* (2013.01); *G01R 29/0878* (2013.01); *G08B 21/18* (2013.01)

(58) Field of Classification Search
CPC . G01R 1/00; G01R 1/04; G01R 1/045; G01R 1/067; G01R 31/00; G01R 31/54;
(Continued)

(56) References Cited

U.S. PATENT DOCUMENTS 8,013,608 B2    9/2011  Takegoshi et al.
10,270,527 B1 *  4/2019 Mentovich ....... H04B 10/07955
(Continued)

FOREIGN PATENT DOCUMENTS

CN    201242552 Y   5/2009
CN    202840033 U   3/2013
(Continued)

OTHER PUBLICATIONS

NPL Search (Nov. 1, 2023).*
(Continued)

*Primary Examiner* — Van T Trieu
(74) *Attorney, Agent, or Firm* — Maschoff Brennan; Brent A. Johnson; Yuefen Zhou

(57) ABSTRACT

The present disclosure provides a radio frequency thimble for production testing, in engagement connection with a test socket. The radio frequency thimble comprises: a housing, a probe, a light transmission member, and a color recognition sensor. The probe is located in a cavity of the housing. An accommodation hole is provided in the probe. The light transmission member is installed in the accommodation hole. A first end of the light transmission member is exposed at an end portion of the probe. A second end of the light transmission member is connected to the color recognition sensor. The light transmission member is used to transmit, to the color recognition sensor, light reflected by a reflective surface near the end portion of the probe. The color recognition sensor is used to recognize the color of the reflected light and determine whether the end portion of the probe is aligned with a terminal.

17 Claims, 4 Drawing Sheets

(58) Field of Classification Search
CPC ......... G08B 21/18; G06F 17/00; G06F 19/00; G06F 19/06; G01N 21/25; G01N 21/33; G01N 21/35; G01N 21/63; G01N 21/87; G01N 25/18; G01N 27/00; G01N 27/02; G01N 27/04

See application file for complete search history.

(56) References Cited

U.S. PATENT DOCUMENTS

| | | | |
|---|---|---|---|
| 2011/0315757 A1* | 12/2011 | Colman | F16L 37/24 235/487 |
| 2018/0235556 A1* | 8/2018 | Speeg | G01T 1/202 |
| 2019/0113538 A1 | 4/2019 | Bresser et al. | |
| 2022/0120695 A1* | 4/2022 | Zhu | G01N 21/35 |

FOREIGN PATENT DOCUMENTS

| | | |
|---|---|---|
| CN | 203385818 U | 1/2014 |
| CN | 106895921 A | 6/2017 |
| CN | 107534249 A | 1/2018 |
| CN | 110907664 A | 3/2020 |

OTHER PUBLICATIONS

International Search Report and Written Opinion of the International Searching Authority for PCT/CN2020/117836 dated Dec. 30, 2020.
Office Action in corresponding Chinese application, 2019110795775, dated Nov. 18, 2020 English machine translation also attached.
Notification to Grant Patent Right in corresponding Chinese application, 201911079577.5, dated Nov. 18, 2020 English machine translation also attached.

* cited by examiner

RADIO FREQUENCY EJECTOR PIN FOR PRODUCTION TESTING AND RADIO FREQUENCY TEST SYSTEM

CROSS-REFERENCE TO RELATED APPLICATIONS

This application is a continuation application of International Application No. PCT/CN2020/117836, filed on Sep. 25, 2020, which claims priority to Chinese Application No. 201911079577.5, filed on Nov. 7, 2019. Both of the above applications are incorporated by reference herein.

TECHNICAL FIELD

The present disclosure relates to the technical field of radio frequency tests, in particular to a radio frequency thimble for production testing and a radio frequency test system.

BACKGROUND

In a radio frequency production testing process, a radio frequency thimble needs to be provided coaxially with a test socket through a radio frequency jig, and the radio frequency thimble needs to be pressed down to contact and conduct with the coaxial connector test socket, so as to conduct a radio frequency signal test. In practice, due to position deviation of the thimble, moving structure deviation of the radio frequency jig, deviation caused by self-bending of the radio frequency thimble as a perishable consumable, and soldered deviation of the coaxial test socket, and so on, the radio frequency thimble may not accurately jack into the center of the coaxial connector, or may jack into an insulation layer of the inner ring of the coaxial connector, resulting in a radio frequency open circuit and contact failure.

SUMMARY

One aspect of the present disclosure provides a radio frequency thimble for production testing, in engagement connection with a test socket, the radio frequency thimble includes a housing, a probe, a light transmission member and a color recognition sensor.

The probe is located in a cavity of the housing. An accommodation hole is provided in the probe. The light transmission member is installed in the accommodation hole. A first end of the light transmission member is exposed at an end portion of the probe. A second end of the light transmission member is connected to the color recognition sensor. The light transmission member is used to transmit, to the color recognition sensor, light reflected by a reflective surface near the end portion of the probe. The color recognition sensor is used to recognize on the color of the reflected light and determine, according to the color of the reflected light, whether the end portion of the probe is aligned with a terminal of the test socket having a preset color.

Another aspect of the present disclosure provides a radio frequency test system, including a test socket and the radio frequency thimble for production testing as above mentioned.

REFERENCE SIGNS

100—radio frequency thimble; 11—housing; 111—cavity; 112—opening; 12—probe; 13—light transmission member; 131—fiber core; 132—cladding; 133—coating; 14—color recognition sensor; 141—white light source; 142—sensor probe; 143—package housing; 144—circuit board; 145—LED lamp; 146—reflector; 147—ring shade; 200—test socket; 21—terminal; 22—insulation layer.

DESCRIPTION OF EMBODIMENTS

To make the objectives, technical solutions, and advantages of embodiments of the present disclosure clearer, the following clearly and comprehensively describes the technical solutions in embodiments of the present disclosure with reference to the accompanying drawings in embodiments of the present disclosure. Apparently, the described embodiments are merely a part rather than all embodiments of the present disclosure. All other embodiments obtained by persons of ordinary skill in the art based on embodiments of the present disclosure without creative effort shall fall within the protection scope of the present disclosure.

The present disclosure is described below with reference to the accompanying drawings and in connection with specific embodiments.

The present disclosure provides a radio frequency thimble for production testing and a radio frequency test system to solve the problem that it is difficult to detect the deviation of the radio frequency thimble during production testing in the related art.

Embodiment I

Figure 1:
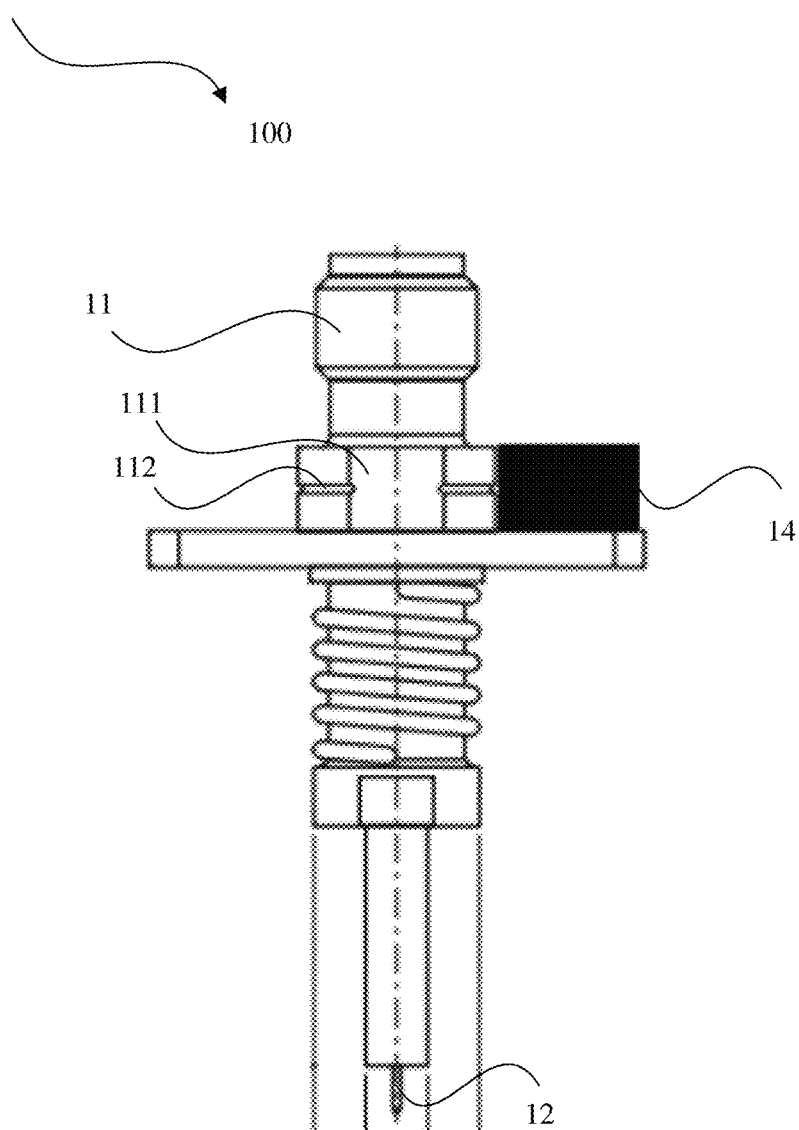
FIG. 1 is a schematic diagram of an overall structure of a radio frequency thimble for production testing provided by an embodiment of the present disclosure.
Figure 2:
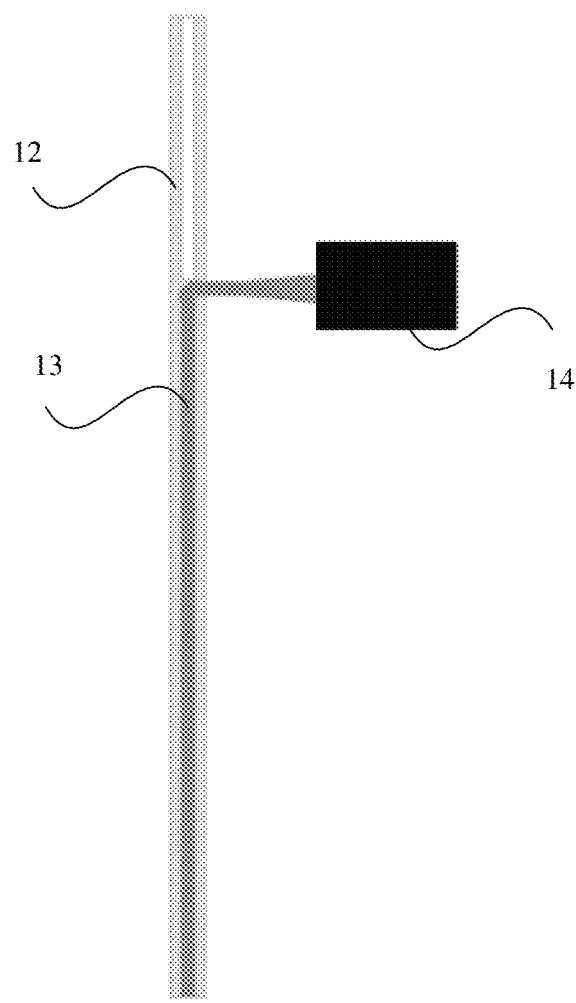
FIG. 2 is a schematic diagram of the connection of a probe, a light transmission member and a color recognition sensor provided by an embodiment of the present disclosure.

FIG. 1 is a schematic diagram of the overall structure of the radio frequency thimble for production testing provided by an embodiment of the present disclosure, and FIG. 2 is a schematic diagram of the connection of the probe, the light transmission member and the color recognition sensor provided by an embodiment of the present disclosure. Referring to FIG. 1 and FIG. 2, the embodiment of the present disclosure provides a radio frequency thimble 100 in engagement connection with a test socket 200.

During the production testing, the radio frequency thimble 100 needs to be provided coaxially with the test socket 200 through the radio frequency jig, and the radio frequency thimble 100 needs to be pressed down to contact and conduct with the coaxial connector test socket 200, so as to conduct a radio frequency signal test.

In the production test process, there are many reasons for poor radio frequency signal testing, such as design problems of the radio frequency jig, electrical performance failure of main board, wire damage, instrument fault, etc. With multiple tests, tiny deviation of the radio frequency thimble 100 may make the production test sometimes faulty and sometimes normal. Worse still, the more radio frequency test items there are, the more related mis-testing problems there are. More problem categories will point to more possible causes, which is not conducive to locate the cause of the mis-testing problems.

In order to visually detect whether the radio frequency thimble 100 and the test socket 200 fit in place, the embodiment of the present disclosure provides the radio frequency thimble 100.

Specifically, the radio frequency thimble 100 includes: a housing 11, a probe 12, a light transmission member 13 and a color recognition sensor 14. The probe 12 is located in a cavity 111 of the housing 11. An accommodation hole is provided in the probe 12. The light transmission member 13 is installed in the accommodation hole. A first end of the light transmission member 13 is exposed at an end portion of probe 12. A second end of the light transmission member 13 is connected to the color recognition sensor 14. The light transmission member 13 is used to transmit, to the color recognition sensor 14, light reflected by a reflective surface near the end portion of the probe 12. The color recognition sensor 14 is used to recognize the color of the reflected light and determine, according to the color of the reflected light, whether the end portion of the probe 12 is aligned with the terminal of the test socket having a preset color.

The probe 12 is provided in the center of the housing 11, and is used for contacting with the terminal in the center of the test socket 200 during production testing to form the conduction of the radio frequency signal. The probe 12 can have elasticity, after being pressed down to the center of the test socket 200, can make a radio frequency pathway and a back end open circuit, while not causing damage to the test socket 200.

At this point, the probe 12 has a hollow structure, an accommodation hole is provided in the probe 12 for the installation of the light transmission member 13. Due to the skin effect of radio frequency energy, the difference in energy transfer between the impedance-controlled hollow-structured of the probe 12 and the solid-structured existing probe is negligible. The light transmission member 13 is assembled inside the probe 12 and connected to the color recognition sensor 14 outside the probe 12. The light reflected by the reflective surface near the end portion of the probe 12 is transmitted to the color recognition sensor 14 through the light transmission member 13, the color recognition sensor 14 can recognize the color of the reflected light and compares the color of the reflected light with the preset color, and when the color of the reflected light is consistent with the preset color, determines that the end portion of the probe 12 is aligned with the terminal of the test socket 200 having the preset color, and when the color of the reflected light is not consistent with the preset color, determines that the end portion of the probe 12 is not aligned with the terminal of the test socket 200 having the preset color.

The working principle of the radio frequency thimble for production testing provided in this embodiment is that the color recognition sensor 14 can emit white light and transmit it to the end portion of the probe 12 through the light transmission member 13, and when the end portion of the probe 12 is close to the test socket 200, its close surface acts as a reflective surface to reflect the light, and the reflected light is consistent with the color of the reflective surface, and then, it is transmitted to the color recognition sensor 14 through the light transmission member 13, and the color recognition sensor 14 can recognize the color of the reflected light, so as to determine the color of the reflective surface to which the end portion of the probe 12 approaches, and then determine whether the end portion of the probe 12 is aligned with the terminal of the test socket 200 having a preset color based on the color.

The light transmission member 13 is used to conduct light, and connect with the color recognition sensor 14. The specific implementation of the light transmission member 13 can have a variety of forms.

When the color recognition sensor 14 has large light source energy and high sensitivity, the conductive performance requirements for the light transmission member 13 are lower. At this time, the light transmission member 13 can be quartz glass or highly transparent polymer, such as polystyrene (PS), polymethyl methacrylate (PMMA), polycarbonate (PC), etc.

When the color recognition sensor 14 has small light source energy and low sensitivity, the conductive performance requirements for light transmission member 13 are higher. In this case, the light transmission member 13 can be provided as a fully reflective optical fiber.

Figure 3:
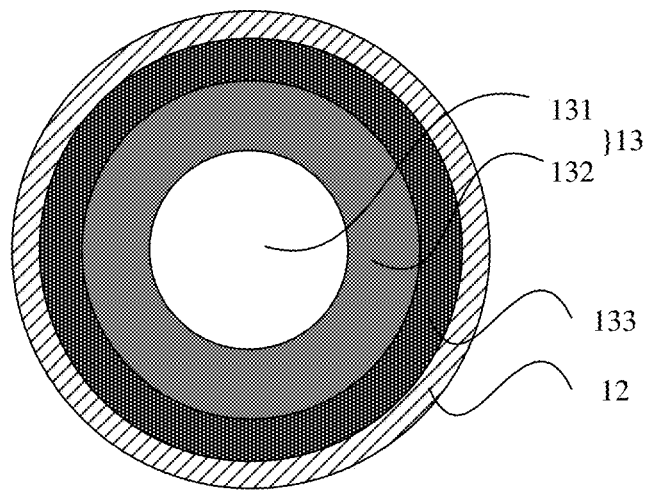
FIG. 3 is a schematic diagram of the cross-sectional structure of the probe and the light transmission member provided by an embodiment of the present disclosure.

FIG. 3 shows a schematic diagram of the cross-sectional structure of the probe and the light transmission member provided by an embodiment of the present disclosure. With reference to FIG. 3, the total reflection optical fiber includes a fiber core 131 and a cladding 132 covered around the fiber core 131, and a coating 133 is filled between the total reflection optical fiber and the inner wall of the accommodation hole.

The fiber core 131 can be high purity quartz material with a generally refractive index of 1.47, and the cladding 132 can be quartz material with a dopant (e.g., $GeO_2$) added to reduce the refractive index of the cladding 132, so that the refractive index of the cladding 132 is lower than the refractive index of the fiber core 131, allowing the light transmission to be enclosed in fiber core 131 and improving the accuracy of color measurement. To improve the reliability of the connection between the total reflection fiber and the probe 12, the gap between the inside of the probe 12 and the cladding 132 may be filled with a coating 133.

Optionally, the core 131 has a diameter of 50 microns and the cladding 132 has a diameter of 125 microns. The cladding 132 and the fiber core 131 are made by a process of first making a cylindrical shape, then heating and drawing to form a size that can be assembled inside the probe 12, and then heating and bending to form a light guide structure with gradually widening ends, and the gradually widening ends are used to match and connect with the color recognition sensor 14.

In one possible implementation, the side wall of the housing 11 has an opening 112 for connecting the exterior of the housing 11 and the cavity 111, and the second end of the light transmission member 13 is protruded from the opening 112. The light transmission member 13 protruding from the opening 112 has a uniformly increasing width to connect to the color recognition sensor 14.

The opening 112 can be a glue injection hole on the radio frequency thimble 100, the opening 112 is provided on the side wall of the housing 11, which can facilitate the injection of glue into the cavity 111 to enhance the reliability of the probe structure and prevent the probe 12 from falling off. The color recognition sensor 14 is provided outside the opening 112, and the second end of the light transmission member 13 is protruded from the opening 112, and the second end of the light transmission member 13 is provided with a light guiding structure with the above-mentioned gradually widening ends to connect with the color recognition sensor 14.

Figure 4:
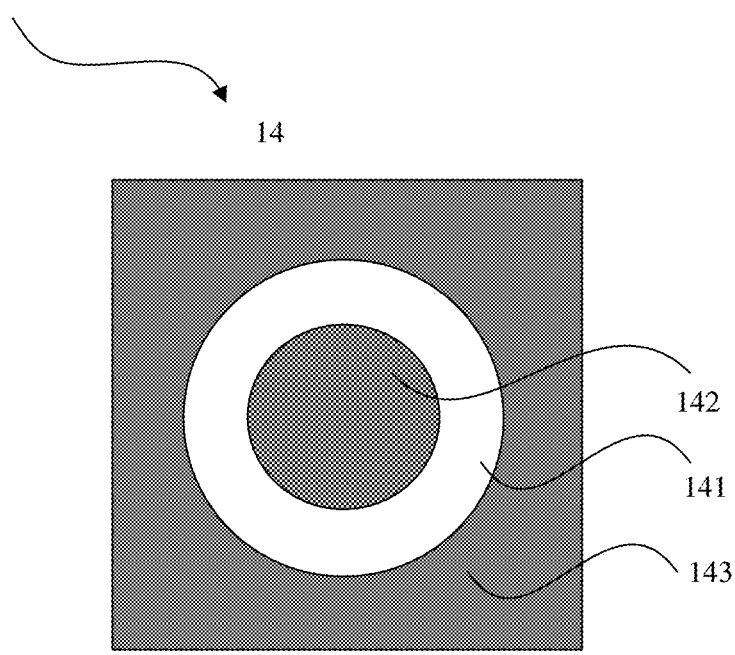
FIG. 4 is a schematic diagram of the external structure of the color recognition sensor provided by an embodiment of the present disclosure.

FIG. 4 is a schematic diagram of the external structure of the color recognition sensor provided by an embodiment of the present disclosure. With reference to FIG. 4, the color recognition sensor 14 includes a white light source 141 and a sensor probe 142. The white light source 141 is a ring-shaped light source provided around the sensor probe 142, and the sensor probe 142 is connected to the second end of the light transmission member 13.

Compared with the structure of placing the light source and sensor probe horizontally, in this embodiment, the white light source 141 is designed to be provided around the sensor probe 142, which can reduce the size of the color recognition sensor 14. And the ring-shaped light source facilitates the uniformity of light transmission in the light transmission member 13, thus facilitating the accuracy of color detection.

Figure 5:
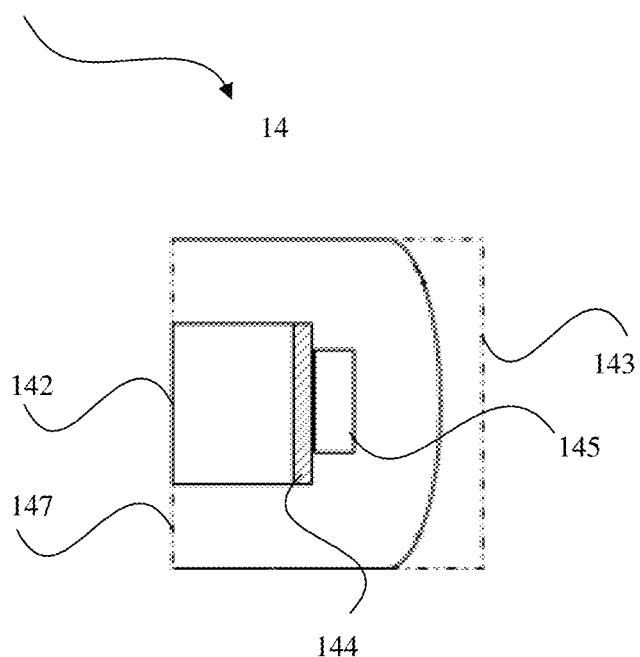
FIG. 5 is a schematic diagram of the internal structure of the color recognition sensor provided by an embodiment of the present disclosure.

FIG. 5 is a schematic diagram of the internal structure of the color recognition sensor provided by an embodiment of the present disclosure, the color recognition sensor 14 also includes a package housing 143. A circuit board 144 is provided inside the package housing 143. The white light source 141 includes an LED lamp 145, a reflector 146 and a ring shade 147. The LED lamp 145 and the sensor probe 142 are respectively connected to the circuit board 144. The reflector 146 is provided around the LED lamp 145. The ring shade 147 is provided around the sensor probe 142.

Further, since the radio frequency thimble 100 is a consumable material in production testing, it needs to be replaced periodically, but the color recognition sensor 14 inside the radio frequency thimble 100 is not a consumable item, and in order to reduce the replacement cost of the radio frequency thimble 100, the color recognition sensor 14 and the housing 11 can be detachably connected to reuse the color recognition sensor 14 when replacing the radio frequency thimble 100.

On the basis of the above embodiment, the radio frequency thimble further includes: an alarm device, the alarm device is connected to the color recognition sensor 14, the alarm device is used to send an alarm prompt when the color recognition sensor determines that the probe 12 is not aligned with the terminal having the preset color, so as to promptly remind the staff to overhaul the radio frequency jig, or replace the radio frequency thimble to exclude the problem of deviations of the probe 12.

The alarm device includes at least one of a warning light, a buzzer and a display. Optionally, the alarm device is provided as a warning light, and the warning light is connected to the circuit board in the color recognition sensor 14 and is fixedly connected to the radio frequency thimble 100, which can light up when the color recognition sensor 12 determines that the probe 12 is not aligned with the terminal having the preset color to serve as a reminder.

In order to prevent external electromagnetic interference, the radio frequency thimble 100 often needs to be placed in a shielded box for production testing. In this case, the warning light fixed on the radio frequency thimble 100 will not be visible to the staff. Therefore, the alarm device can be set as a buzzer, by sounding to play a reminder role.

Further, the signal from the color recognition sensor 14 can also be led out and connected to a device such as a warning light, a buzzer or a display outside the shielding box to complete the visual and auditory feedback to the staff.

The radio frequency thimble for production testing provided by the present embodiment, by providing the light transmission member inside the probe and providing the color recognition sensor to connect with the light transmission member, thus whether the radio frequency thimble is aligned with the test socket can be determined according to close color of the end portion of the probe to effectively detect the open circuit problem caused by the deviation of the radio frequency thimble. Therefore, the circuit of product circuit board does not need to be extended, and the color recognition sensor has good compatibility with radio frequency, so it effective guarantees signal transmission performance And the radio frequency thimble is applicable to current widely used radio frequency coaxial connectors, which means it has low cost and wide range of application.

Embodiment II

Embodiment II of the present disclosure provides a radio frequency test system including a test socket 200 and a radio frequency thimble 100 for production testing as provided in the above embodiment.

During the production testing, the radio frequency thimble 100 needs to be provided coaxially with the test socket 200 through the radio frequency jig, and the radio frequency thimble 100 needs to be pressed down to contact and conduct with the coaxial connector test socket 200, so as to conduct a radio frequency signal test.

Specifically, the radio frequency thimble 100 includes: a housing 11, a probe 12, a light transmission member 13 and a color recognition sensor 14. The probe 12 is located in a cavity 111 of the housing 11. An accommodation hole is provided in the probe 12. The light transmission member 13 is installed in the accommodation hole. A first end of the light transmission member 13 is exposed at an end portion of probe 12. A second end of the light transmission member 13 is connected to the color recognition sensor 14. The light transmission member 13 is used to transmit, to the color recognition sensor 14, light reflected by a reflective surface near the end portion. The color recognition sensor 14 is used to recognize the color of the reflected light and determine, according to the color of the reflected light, whether the end portion of the probe 12 is aligned with a terminal of the test socket having a preset color.

Figure 6:
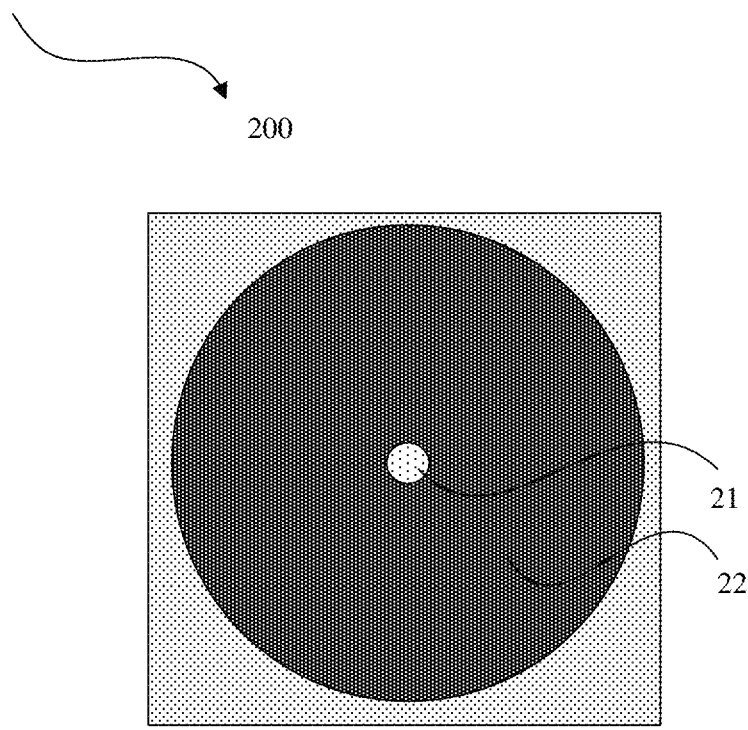
FIG. 6 is a schematic diagram of the structure of a test socket provided by an embodiment of the present disclosure.

FIG. 6 is a schematic diagram of the structure of the test socket provided by an embodiment of the present disclosure. With reference to FIG. 6, the test socket 200 includes: a terminal 21 having a preset color and located in the center, and an insulating layer 22 located in the outer ring of the terminal 21, where the insulating layer 22 having a color different from the preset color.

The test socket 200 can be a coaxial connector, the coaxial connector includes a terminal 31 in the center. The terminal 21 is made of copper alloy or stainless steel, the insulating layer 22 located on the outside of the terminal 21 is generally black, the color recognition sensor 14 can distinguish the gold color of copper alloy, the silver color of stainless steel, and the black color of the insulating layer 22. Therefore, when the end portion of the probe 12 is close to the test socket 200, if the probe 12 is aligned with the center terminal 21, the terminal 21 as a reflective surface reflects a gold reflected light, the color recognition sensor 14 recognizes a gold color consistent with the preset color, can determine that the end portion of the probe 12 is aligned with terminal 21; if the probe 12 is not aligned with the terminal 21, the end portion of probe 12 is near the insulating layer 22, the insulating layer 22 as the reflective surface reflects the black reflected light, and the color recognition sensor 14 recognizes the black color that is inconsistent with the preset color, then it is judged that the end portion of the probe 12 is not aligned with the terminal 21.

The radio frequency test system provided by the present embodiment includes the radio frequency thimble and the test socket, by providing the light transmission member inside the probe of the radio frequency thimble, and providing the color recognition sensor connected to the light transmission member, thus whether the radio frequency thimble is aligned with the test socket can be determined according to close color of the end portion of the probe to effectively detect the open circuit problem caused by the deviation of the radio frequency thimble. Therefore, the circuit of product circuit board does not need to be extended, and the color recognition sensor has good compatibility with radio frequency, so it effective guarantees signal transmission performance. And the radio frequency thimble is applicable to current widely used radio frequency coaxial connectors, which means it has low cost and wide range of application.

The present disclosure provides a radio frequency thimble for production testing and a radio frequency test system to solve the problem that it is difficult to detect the deviation of the radio frequency thimble during production testing in the prior art.

One aspect of the present disclosure provides a radio frequency thimble for production testing, in engagement connection with a test socket, the radio frequency thimble includes a housing, a probe, a light transmission member and a color recognition sensor.

The probe is located in a cavity of the housing. An accommodation hole is provided in the probe. The light transmission member is installed in the accommodation hole. A first end of the light transmission member is exposed at an end portion of the probe. A second end of the light transmission member is connected to the color recognition sensor. The light transmission member is used to transmit, to the color recognition sensor, light reflected by a reflective surface near the end portion of the probe. The color recognition sensor is used to recognize on the color of the reflected light and determine, according to the color of the reflected light, whether the end portion of the probe is aligned with a terminal of the test socket having a preset color.

The light transmission member includes a total reflective fiber. The total reflective fiber includes a fiber core and a cladding covered the fiber core. A coating is filled between the total reflective fiber and an inner wall of the accommodation hole.

The housing has an opening in a side wall for connecting an exterior of the housing and the cavity. The second end of the light transmission member is protruded from the opening. The light transmission member protruding from the opening has a uniformly increasing width to connect to the color recognition sensor.

The color recognition sensor comprises a white light source and a sensor probe. The white light source is a ring-shaped light source provided around the sensor probe. The sensor probe is connected to the second end of the light transmission member.

The color recognition sensor further includes a package housing, a circuit board is provided inside the package housing. The white light source includes an LED lamp, a reflector and a ring shade. The LED lamp and the sensor probe are respectively connected to the circuit board. The reflector is provided around the LED lamp. The ring shade is provided around the sensor probe.

The color recognition sensor and the housing are detachably connected.

The radio frequency thimble further includes an alarm device, the alarm device is connected to the color recognition sensor. The alarm device is used to send an alarm prompt when the color recognition sensor determines that the probe is not aligned with the terminal having the preset color.

The alarm device includes at least one of a warning light, a buzzer and a display.

The radio frequency thimble for production testing provided by the present embodiment, by providing the light transmission member inside the probe and providing the color recognition sensor to connect with the light transmission member, thus whether the radio frequency thimble is aligned with the test socket can be determined according to close color of the end portion of the probe to effectively detect the open circuit problem caused by the deviation of the radio frequency thimble. Therefore, the circuit of product circuit board does not need to be extended, and the color recognition sensor has good compatibility with radio frequency, so it effective guarantees signal transmission performance. And the radio frequency thimble is applicable to current widely used radio frequency coaxial connectors, which means it has low cost and wide range of application.

Another aspect of the present disclosure provides a radio frequency test system, including a test socket and the radio frequency thimble for production testing as above mentioned.

The test socket includes: a terminal having preset color and located in the center, and an insulating layer located on the outer ring of the terminal. The insulating layer having a color different from the preset color.

The radio frequency test system provided by the present embodiment includes the radio frequency thimble and the test socket, by providing the light transmission member inside the probe of the radio frequency thimble, and providing the color recognition sensor connected to the light transmission member, thus whether the radio frequency thimble is aligned with the test socket can be determined according to close color of the end portion of the probe to effectively detect the open circuit problem caused by the deviation of the radio frequency thimble. Therefore, the circuit of product circuit board does not need to be extended, and the color recognition sensor has good compatibility with radio frequency, so it effective guarantees signal transmission performance And the radio frequency thimble is applicable to current widely used radio frequency coaxial connectors, which means it has low cost and wide range of application.

Finally, it should be noted that: the above embodiments are only used to illustrate the technical solution of the present disclosure, not to limit it; although the present disclosure has been described in detail with reference to the foregoing embodiments, the ordinary skilled person in the field should understand that it is still possible to modify the technical solution recorded in the foregoing embodiments, or the equivalent replacement of some or all of the technical features; and these modifications or replacements, the does not make the essence of the corresponding technical solutions out of the scope of the technical solutions of the embodiments of the present disclosure.

What is claimed is:

1. A radio frequency thimble for production testing, in engagement connection with a test socket, the radio frequency thimble comprises a housing, a probe, a light transmission member, and a color recognition sensor;

wherein the probe is located in a cavity of the housing; an accommodation hole is provided in the probe, the light transmission member is installed in the accommodation hole, a first end of the light transmission member is exposed at an end portion of the probe, a second end of the light transmission member is connected to the color recognition sensor, the light transmission member is used to transmit, to the color recognition sensor, light reflected by a reflective surface near the end portion of the probe, the color recognition sensor is used to perform recognize the color of the reflected light and determine, according to the color of the reflected light, whether the end portion of the probe is aligned with a terminal of the test socket having a preset color.

2. The radio frequency thimble for production testing according to claim 1, wherein the light transmission member comprises a total reflective fiber, the total reflective fiber comprises a fiber core and a cladding covered the fiber core, and a coating is filled between the total reflective fiber and an inner wall of the accommodation hole.

3. The radio frequency thimble for production testing according to claim 1, wherein the housing has an opening in a side wall for connecting an exterior of the housing and the cavity, the second end of the light transmission member is protruded from the opening, and the light transmission member protruding from the opening has a uniformly increasing width to connect to the color recognition sensor.

4. The radio frequency thimble for production testing according to claim 1, wherein the color recognition sensor comprises a white light source and a sensor probe, the white light source is a ring-shaped light source provided around the sensor probe, and the sensor probe is connected to the second end of the light transmission member.

5. The radio frequency thimble for production testing according to claim 4, wherein the color recognition sensor further comprises a package housing, a circuit board is provided inside the package housing, the white light source comprises an LED lamp, a reflector and a ring shade, the LED lamp and the sensor probe are respectively connected to the circuit board, the reflector is provided around the LED lamp, and the ring shade is provided around the sensor probe.

6. The radio frequency thimble for production testing according to claim 5, wherein the color recognition sensor and the housing are detachably connected.

7. The radio frequency thimble for production testing according to claim 1, wherein the radio frequency thimble further comprises an alarm device, the alarm device is connected to the color recognition sensor, the alarm device is used to send an alarm prompt when the color recognition sensor determines that the probe is not aligned with the terminal having the preset color.

8. The radio frequency thimble for production testing according to claim 7, wherein the alarm device comprises at least one of a warning light, a buzzer and a display.

9. A radio frequency test system, comprising a test socket and the radio frequency thimble for production testing, wherein the radio frequency thimble comprises a housing, a probe, a light transmission member, and a color recognition sensor, the probe is located in a cavity of the housing; an accommodation hole is provided in the probe, the light transmission member is installed in the accommodation hole, a first end of the light transmission member is exposed at an end portion of the probe, a second end of the light transmission member is connected to the color recognition sensor, the light transmission member is used to transmit, to the color recognition sensor, light reflected by a reflective surface near the end portion of the probe, the color recognition sensor is used to perform recognize the color of the reflected light and determine, according to the color of the reflected light, whether the end portion of the probe is aligned with a terminal of the test socket having a preset color.

10. The radio frequency test system according to claim 9, wherein the light transmission member comprises a total reflective fiber, the total reflective fiber comprises a fiber core and a cladding covered the fiber core, and a coating is filled between the total reflective fiber and an inner wall of the accommodation hole.

11. The radio frequency test system according to claim 9, wherein the housing has an opening in a side wall for connecting an exterior of the housing and the cavity, the second end of the light transmission member is protruded from the opening, and the light transmission member protruding from the opening has a uniformly increasing width to connect to the color recognition sensor.

12. The radio frequency test system according to claim 9, wherein the color recognition sensor comprises a white light source and a sensor probe, the white light source is a ring-shaped light source provided around the sensor probe, and the sensor probe is connected to the second end of the light transmission member.

13. The radio frequency test system according to claim 12, wherein the color recognition sensor further comprises a package housing, a circuit board is provided inside the package housing, the white light source comprises an LED lamp, a reflector and a ring shade, the LED lamp and the sensor probe are respectively connected to the circuit board, the reflector is provided around the LED lamp, and the ring shade is provided around the sensor probe.

14. The radio frequency test system according to claim 13, wherein the color recognition sensor and the housing are detachably connected.

15. The radio frequency test system according to claim 9, wherein the radio frequency thimble further comprises an alarm device, the alarm device is connected to the color recognition sensor, the alarm device is used to send an alarm prompt when the color recognition sensor determines that the probe is not aligned with the terminal having the preset color.

16. The radio frequency test system according to claim 15, wherein the alarm device comprises at least one of a warning light, a buzzer and a display.

17. The radio frequency test system according to claim 9, wherein the test socket comprises: the terminal having preset color and located in the center, and an insulating layer located on the outer ring of the terminal, wherein the insulating layer having a color different from the preset color.

* * * * *